(12) United States Patent
Jeong et al.

(10) Patent No.: US 11,037,610 B2
(45) Date of Patent: Jun. 15, 2021

(54) READ TIME-OUT MANAGERS AND MEMORY SYSTEMS INCLUDING THE READ TIME-OUT MANAGERS

(71) Applicant: SK hynix Inc., Icheon-si (KR)

(72) Inventors: Seunggyu Jeong, Icheon-si (KR); Jung Hyun Kwon, Seoul (KR); Wongyu Shin, Icheon-si (KR); Do Sun Hong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 425 days.

(21) Appl. No.: 16/210,303

(22) Filed: Dec. 5, 2018

(65) Prior Publication Data
US 2019/0267055 A1 Aug. 29, 2019

(30) Foreign Application Priority Data
Feb. 23, 2018 (KR) .................. 10-2018-0022154

(51) Int. Cl.
| | |
|---|---|
| *G11C 7/22* | (2006.01) |
| *G11C 16/32* | (2006.01) |
| *G11C 16/26* | (2006.01) |
| *G06F 9/30* | (2018.01) |
| *G06F 11/07* | (2006.01) |
| *G06F 11/30* | (2006.01) |
| *G11C 7/10* | (2006.01) |

(52) U.S. Cl.
CPC .............. *G11C 7/22* (2013.01); *G06F 9/3001* (2013.01); *G06F 11/0757* (2013.01); *G06F 11/3037* (2013.01); *G11C 7/1072* (2013.01); *G11C 16/26* (2013.01); *G11C 16/32* (2013.01); *G06F 2201/88* (2013.01)

(58) Field of Classification Search
CPC ............. G06F 11/0757; G06F 11/3037; G06F 2201/88; G06F 9/3001; G11C 11/4076; G11C 16/26; G11C 16/32; G11C 2207/2281; G11C 7/1063; G11C 7/1072; G11C 7/22
See application file for complete search history.

(56) References Cited

U.S. PATENT DOCUMENTS

| | | | |
|---|---|---|---|
| 9,318,182 B2 * | 4/2016 | Lovelace | G11C 29/42 |
| 2013/0024864 A1 * | 1/2013 | Lakshmi | G06F 9/3851 |
| | | | 718/102 |
| 2015/0219474 A1 * | 8/2015 | Julicher | G01P 3/486 |
| | | | 702/151 |

* cited by examiner

*Primary Examiner* — Terrell S Johnson
(74) *Attorney, Agent, or Firm* — William Park & Associates Ltd.

(57) ABSTRACT

A read time-out manager may include a counter and a plurality of timers. The counter may generate a counter output signal based on a first cycle time. The plurality of timers may be each configured to be assigned a read identification to measure a time-out period corresponding to the read identification. Each of the plurality of timers may operate in synchronization with the counter output signal to generate a time-out signal based on a second cycle time different from the first cycle time.

21 Claims, 8 Drawing Sheets

READ TIME-OUT MANAGERS AND MEMORY SYSTEMS INCLUDING THE READ TIME-OUT MANAGERS

CROSS-REFERENCE TO RELATED APPLICATION

The present application claims priority under 35 U.S.C 119(a) to Korean Application No. 10-2018-0022154, filed on Feb. 23, 2018, which is herein incorporated by references in its entirety.

BACKGROUND

1. Technical Field

Various embodiments of the present disclosure generally relate to memory systems, and more particularly, to read time-out managers, and memory systems including the read time-out managers.

2. Related Art

In some cases, a read operation of data may not be smoothly performed in a read mode of a memory system. In such a case, a memory controller of the memory system may perform a time-out operation to prevent resources of the memory system from being unnecessarily wasted if the read operation is not performed or finished within a predetermined period. During the read operation, the time-out operation may be performed by a timer allocated to correspond to the read data. For example, in the event that a predetermined period for the time-out operation is set to be 1000 seconds, a time-out signal may occur to generate a message notifying the failure of the read operation of the corresponding read data if a period of 1000 seconds elapses on the timer after a read command to the read data occurs. In order to perform the time-out operation, the timer should have capacity to measure at least a predetermined time which is set as the period for the time-out operation. That is, if the period for the time-out operation is set to be 1000 seconds, the timer should be configured to have at least 10 bits. In addition, as the read command to each of the various read data occurs in real time, the number of desired timers has to be consistent with the number of the read data provided together with the read commands.

SUMMARY

According to an embodiment, a read time-out manager may include a counter and a plurality of timers. The counter may generate a counter output signal based on a first cycle time. The plurality of timers may be each configured to be assigned a read identification to measure a time-out period corresponding to the read identification. Each of the plurality of timers may operate in synchronization with the counter output signal to generate a time-out signal based on a second cycle time different from the first cycle time.

According to an embodiment, a memory system may include a memory medium and a memory controller. The memory controller may be configured to control an operation for accessing the memory medium. The memory controller may include a read time-out manager. The read time-out manager may be configured to perform time-out operations for a plurality of read identifications of read data, the read data to be read out from the memory medium based on read commands. The read time-out manager may include a counter and a plurality of timers. The counter may be configured to generate a counter output signal based on a first cycle time. The plurality of timers may be each configured to be assigned a read identification from the plurality of read identifications to measure a time-out period corresponding to the read identification. Each of the plurality of timers may operate in synchronization with the counter output signal to generate a time-out signal based on a second cycle time different from the first cycle time.

According to an embodiment, there may be provided a method of managing a read time-out operation. The method may include executing a counting operation in synchronization with a clock signal to generate a counter output signal based on a first cycle time and executing a timer operation in synchronization with the counter output signal to generate a time-out signal based on a second cycle time different from the first cycle time when a read identification is inputted. The timer operation may terminate when a read operation corresponding to the read identification terminates, and the read time-out operation of the read operation corresponding to the read identification may terminate when the time-out signal is generated.

According to an embodiment, there may be provided another method of managing a read time-out operation. The method may include generating, with a counter, a counter output signal based on a first cycle time. The method may also include assigning a first read identification to a first timer and a second read identification to a second timer to measure a first time-out period corresponding to the first read identification and to measure a second time-out period corresponding to the second read identification. The method may additionally include generating a first time-out signal with the first timer based on a second cycle time different from the first cycle time, in synchronization with the counter output signal. The method may further include generating a second time-out signal with the second timer based on the second cycle time, in synchronization with the counter output signal.

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments may be directed to read time-out managers, and memory systems including the read time-out managers.

Figure 1:
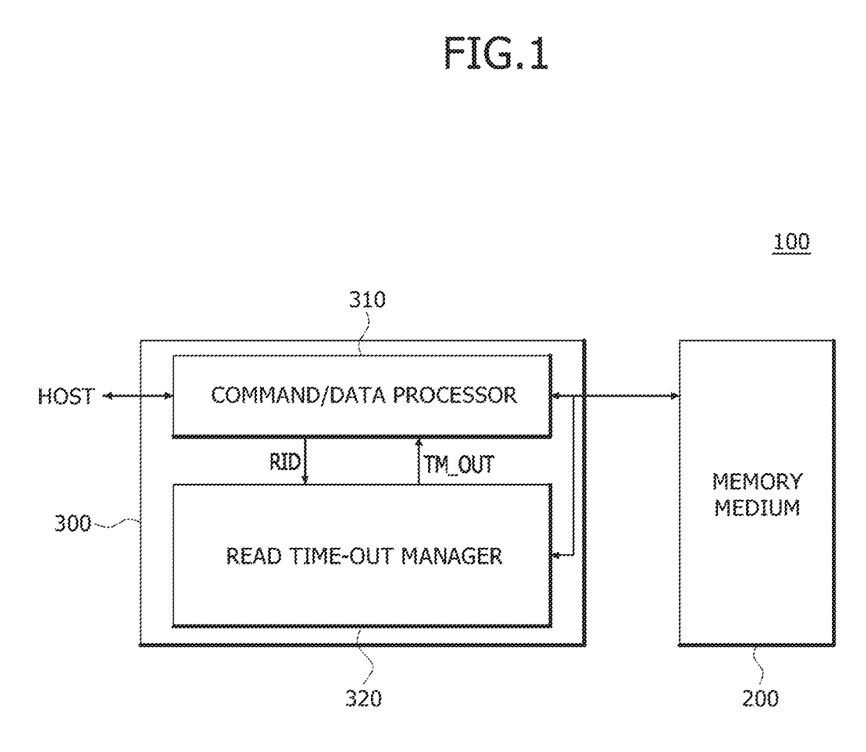
FIG. 1 is a block diagram illustrating a memory system including a read time-out manager according to an embodiment of the present disclosure.

FIG. 1 is a block diagram illustrating a memory system 100 including a read time-out manager 320 according to an embodiment of the present disclosure. Referring to FIG. 1, the memory system 100 may include a memory medium 200 and a memory controller 300. The memory medium 200 may have a data storage space. Data may be written into the data storage space of the memory medium 200 by a write operation controlled by the memory controller 300. In addition, the data stored in the data storage space of the memory medium 200 may be read out by a read operation controlled by the memory controller 300. In an embodiment, the memory medium 200 may include a volatile memory device such as a dynamic random access memory (DRAM) device. Alternatively, the memory medium 200 may include a nonvolatile memory device such as a flash memory device, a phase change random access memory (PCRAM) device, a resistive random access memory (ReRAM) device, a ferroelectric random access memory (FeRAM) device, a magnetic random access memory (MRAM) device, or the like.

The memory controller 300 may control an operation for accessing the memory medium 200 in response to a read command or a write command outputted from a host. The memory controller 300 may be configured to include a command/data processor 310 (i.e., command and data processor 310) and a read time-out manager 320. The command/data processor 310 may process commands and write data generated by the host and read data generated by the memory medium 200. If a write command and write data are transmitted from the host to the command/data processor 310, the command/data processor 310 may perform the write operation for storing the write data into a predetermined location of the memory medium 200. If a read command is transmitted from the host to the command/data processor 310, the command/data processor 310 may perform the read operation for reading out read data stored in a predetermined location of the memory medium 200. If the read command is transmitted to the command/data processor 310, the command/data processor 310 may transmit a read identification RID to the read time-out manager 320. In the present application, the read identification RID may be defined as a unique identification given to the read data to be read by the read command.

The read time-out manager 320 may measure a time in response to the read identification RID outputted from the command/data processor 310. The time measurement of the read time-out manager 320 may be performed until a predetermined period for the time-out operation elapses or the read operation of the read data terminates. If the read operation does not terminate within the predetermined period for the time-out operation, the read time-out manager 320 may generate a time-out signal TM_OUT and may transmit the time-out signal TM_OUT to the command/data processor 310. If the time-out signal TM_OUT is transmitted to the command/data processor 310, the command/data processor 310 may inform the host that the read operation exceeded the predetermined period for the time-out operation. In an embodiment, the read time-out manager 320 may receive a flag signal notifying the termination of the read operation. If the flag signal is inputted to the read time-out manager 320, the read time-out manager 320 may stop the time measurement operation to the corresponding read identification RID and may remove the corresponding read identification RID from a list of time-out operations. In an embodiment, the read time-out manager 320 may directly receive the flag signal from the memory medium 200. In such a case, the memory medium 200 may transmit the read data to the command/data processor 310 and may transmit the read identification RID and the corresponding flag signal to the read time-out manager 320. In another embodiment, the flag signal may be transmitted from the command/data processor 310 to the read time-out manager 320. In such a case, if the command/data processor 310 receives the read data from the memory medium 200, the command/data processor 310 may transmit the read identification RID and the corresponding flag signal to the read time-out manager 320.

Figure 2:
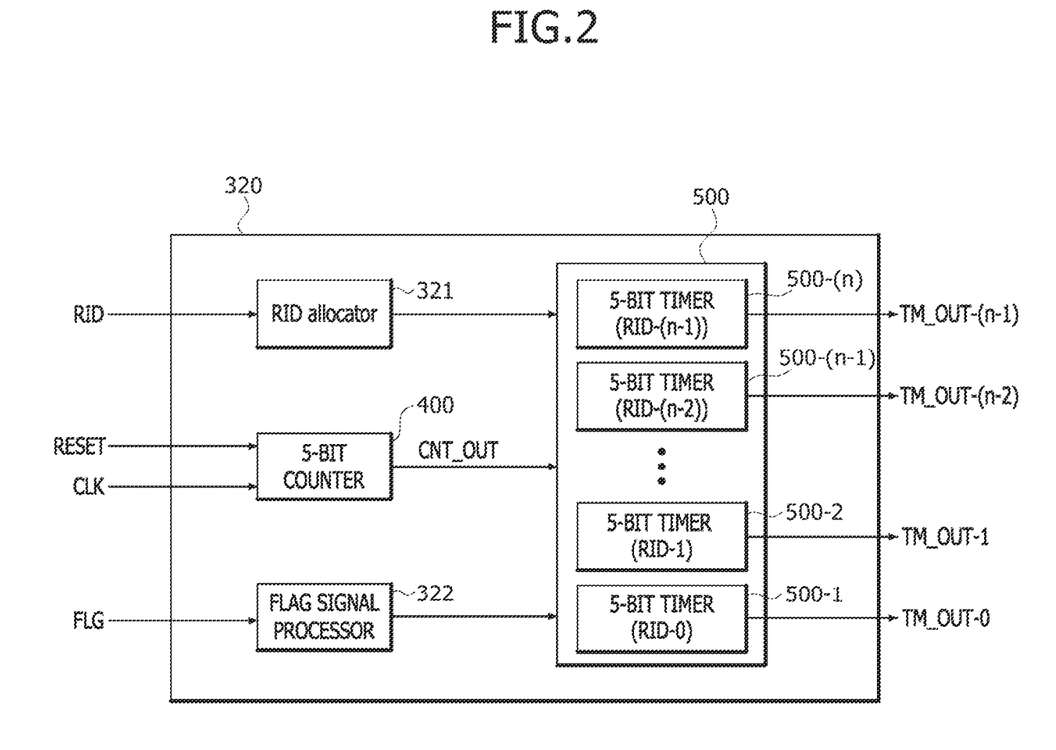
FIG. 2 is a block diagram illustrating the read time-out manager included in the memory system of FIG. 1.

FIG. 2 is a block diagram illustrating the read time-out manager 320 included in the memory system 100 of FIG. 1.

Referring to FIG. 2, the read time-out manager 320 may be configured to include a read identification (RID) allocator 321, a flag signal processor 322, a counter 400, and a timer portion 500. The timer portion 500 may include a plurality of timers, for example, first to $n^{th}$ timers 500-1, 500-2, . . . , 500-($n$-1), and 500-($n$) (where, "n" denotes a natural number). In an embodiment, it may be assumed that a time-out period for the time-out operation performed by the read time-out manager 320 is set to be a period corresponding to 1024 cycle times of a clock signal. The clock signal may be a system clock signal of the memory system (100 of FIG. 1). In general, a timer may operate to be counted up bit by bit whenever a pulse of the clock signal is inputted to the timer. Thus, the timer should be configured to have the capacity of 10 bits which are capable of counting $2^{10}$ times in order to measure a period corresponding to 1024 cycle times of the clock signal. However, according to an embodiment, each of the first to $n^{th}$ timers 500-1, 500-2, . . . , 500-($n$-1,) and 500-($n$) may be configured to have 5 bits corresponding to half of 10 bits. That is, since the read time-out manager 320 according to an embodiment may include the 5-bit counter 400 acting as a common counter that supplies a signal to all of the first to $n^{th}$ timers 500-1, 500-2, . . . , 500-($n$-1), and 500-($n$), each of the first to $n^{th}$ timers 500-1, 500-2, . . . , 500-($n$-1), and 500-($n$) may measure a period corresponding to 1024 cycle times of the clock signal even though each timer is configured to have only 5 bits.

The RID allocator 321 may assign the RID outputted from the command/data processor 310 to an unused timer among the first to $n^{th}$ timers 500-1, 500-2, . . . , 500-($n$-1), and 500-($n$) constituting the timer portion 500. The timer to which the RID is assigned may start to measure the time-out period of a read operation corresponding to the RID. If a flag signal FLG for a specific RID is inputted to the flag signal processor 322 from the memory medium 200 or the command/data processor 310, the flag signal processor 322 may transmit the flag signal FLG to the timer measuring the time-out period corresponding to the specific RID among the first to $n^{th}$ timers 500-1, 500-2, ..., 500-(n−1), and 500-(n) constituting the timer portion 500, thereby terminating a time-out operation for the read operation.

A countable capacity of the counter 400 may be determined by the time-out period and the countable capacity of each of the first to $n^{th}$ timers 500-1, 500-2, ..., 500-(n−1), and 500-(n). In an embodiment, the countable capacity of the counter 400 may be set to be equal to the countable capacity of each of the first to $n^{th}$ timers 500-1, 500-2, ..., 500-(n−1), and 500-(n). In another embodiment, the countable capacity of the counter 400 may be set to be different from the countable capacity of each of the first to $n^{th}$ timers 500-1, 500-2, ..., 500-(n−1), and 500-(n). If the time-out period is set to be a period corresponding to $2^m$ cycle times of the clock signal (where, "m" denotes a natural number) and the counter 400 and each of the timers 500-1, 500-2, ..., 500-(n−1), and 500-(n) are respectively configured to have "a" bits and "b" bits, the values of "a" and "b" may be determined to meet an equation of "a+b=m". In the event that the value of "m" is ten according to an embodiment, the time-out period may be set to be a period corresponding to $2^{10}$ cycle times of the clock signal. Thus, the counter 400 may be configured to have a countable capacity of 5 bits if each of the timers 500-1, 500-2, ..., 500-(n−1), and 500-(n) is configured to have a countable capacity of 5 bits. That is, a sum of the countable capacity (e.g., 5 bits) of the counter 400 and the countable capacity (e.g., 5 bits) of each of the timers 500-1, 500-2, ..., 500-(n−1), and 500-(n) may correspond to a countable capacity that is necessary to measure the time-out period. In some other embodiments, if each of the timers 500-1, 500-2, ..., 500-(n−1), and 500-(n) is configured to have a countable capacity of 4 bits, the counter 400 may be configured to have a countable capacity of 6 bits. In an embodiment, a first cycle time may be set to be a period corresponding to $2^a$ cycle times of the clock signal, and a second cycle time may be set to be a period corresponding to $2^m$ cycle times of the clock signal where "a+b=m".

The counter 400 may receive a reset signal RESET and a clock signal CLK to generate a counter output signal CNT_OUT. The counter 400 may perform a count operation in synchronization with the clock signal CLK. If the reset signal RESET is enabled, the counter 400 may be initialized. A cycle time of the counter output signal CNT_OUT outputted from the counter 400 may be determined by a countable capacity of the counter 400. If the counter 400 is configured to have a countable capacity of "a" bits, a cycle time of the counter output signal CNT_OUT may be set to be a period corresponding to $2^a$ cycle times of the clock signal CLK. In an embodiment, the counter output signal CNT_OUT may be firstly outputted from the counter 400 after $2^5$ clock pulses (i.e. 32 clock pulses) are created from a point of time that the counter 400 starts to operate because the counter 400 is configured to have 5 bits. According to an embodiment, the counter 400 having a countable capacity of 5 bits may generate the counter output signal CNT_OUT on a first cycle time corresponding to $2^5$ or 32 cycle times of the clock signal CLK (e.g., the counter 400 may generate the counter output signal CNT_OUT every 32 cycle times of the clock). Subsequently, the counter output signal CNT_OUT may be periodically generated by the counter 400 whenever 32 clock pulses are created. The counter output signal CNT_OUT outputted from the counter 400 may be inputted to all of the first to $n^{th}$ timers 500-1, 500-2, ..., 500-(n−1), and 500-(n) constituting the timer portion 500.

Each of the first to $n^{th}$ timers 500-1, 500-2, ..., 500-(n−1), and 500-(n) may operate in synchronization with the counter output signal CNT_OUT. The first to $n^{th}$ timers 500-1, 500-2, ..., 500-(n−1), and 500-(n) may be assigned to various RIDs, respectively. In an embodiment, the first timer 500-1 may be assigned to a first read identification RID-0 and may be used to measure the time-out period for the first read identification RID-0, and the second timer 500-2 may be assigned to a second read identification RID-1 and may be used to measure the time-out period for the second read identification RID-1. Similarly, the $(n-1)^{th}$ timer 500-(n−1) may be assigned to an $(n-1)^{th}$ read identification RID-(n−2) and may be used to measure the time-out period for the $(n-1)^{th}$ read identification RID-(n−2), and the $n^{th}$ timer 500-(n) may be assigned to an $n^{th}$ read identification RID-(n−1) and may be used to measure the time-out period for the $n^{th}$ read identification RID-(n−1). Each of the first to $n^{th}$ timers 500-1, 500-2, ..., 500-(n−1), and 500-(n) may output and transmit a time-out signal notifying the elapse of a time-out period for an RID assigned thereto to the command/data processor 310. For example, the first timer 500-1 may output and transmit a first time-out signal TM_OUT-0 notifying the elapse of a time-out period for the first read identification RID-0 assigned thereto to the command/data processor 310, and the second timer 500-2 may output and transmit a second time-out signal TM_OUT-1 notifying the elapse of a time-out period for the second read identification RID-1 assigned thereto to the command/data processor 310. Similarly, the $(n-1)^{th}$ timer 500-(n−1) may output and transmit an $(n-1)^{th}$ time-out signal TM_OUT-(n−2) notifying the elapse of a time-out period for the $(n-1)^{th}$ read identification RID-(n−2) assigned thereto to the command/data processor 310, and the $n^{th}$ timer 500-(n) may output and transmit an $n^{th}$ time-out signal TM_OUT-(n−1) notifying the elapse of a time-out period for the $n^{th}$ read identification RID-(n−1) assigned thereto to the command/data processor 310. In an embodiment, each of the first to $n^{th}$ timers 500-1, 500-2, ..., 500-(n−1), and 500-(n) may generate a respective time-out signal [i.e., TM_OUT-0~TM_OUT-(n−1)] based on a second cycle time corresponding to $2^{10}$ or 1024 cycle times of the clock signal CLK, where the time-out period is set to be a period corresponding to $2^{10}$ or 1024 cycle times of the clock signal CLK. For example, in some embodiments, each of the first to $n^{th}$ timers 500-1, 500-2, ..., 500-(n−1), and 500-(n) may generate a respective time-out signal [i.e., TM_OUT-0~TM_OUT-(n−1)] in synchronization with a second cycle time corresponding to $2^{10}$ or 1024 cycle times of the clock signal CLK, where the time-out period is set to be a period corresponding to $2^{10}$ or 1024 cycle times of the clock signal CLK.

Figure 3:
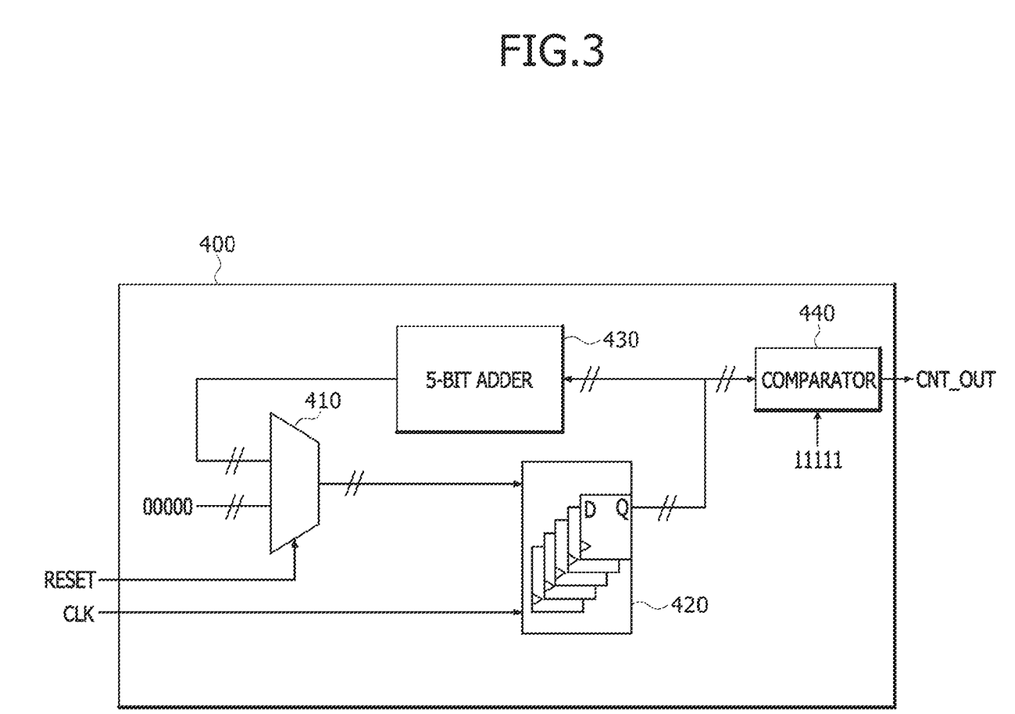
FIG. 3 is a block diagram illustrating a counter included in the read time-out manager of FIG. 2.

FIG. 3 is a block diagram illustrating a configuration of an example of the 5-bit counter 400 included in the read time-out manager 320 of FIG. 2. Referring to FIG. 3, the 5-bit counter 400 may be configured to include a multiplexer 410, a 5-bit register 420, a 5-bit adder 430, and a comparator 440. The multiplexer 410 may receive 5-bit data of '00000' as initial data and 5-bit added data outputted from the 5-bit adder 430. The multiplexer 410 may firstly output the 5-bit initial data of '00000' as initial output data in response to the reset signal RESET. After the 5-bit initial data of '00000' are outputted from the multiplexer 410, the multiplexer 410 may output the 5-bit added data which are generated by the 5-bit adder 430. The 5-bit initial data of '00000' or the 5-bit added data outputted from the multiplexer 410 may be inputted to the 5-bit register 420.

The 5-bit register 420 may be realized using five D-flip-flops. Each of the five D-flipflops may provide one bit. The 5-bit initial data or the 5-bit added data outputted from the multiplexer 410 may be inputted to "D"-input terminals of the five D-flipflops, respectively. Output signals of the five D-flipflops may be outputted through "Q"-output terminals of the five D-flipflops, respectively. The 5-bit register 420 may be synchronized with the clock signal CLK to generate 5-bit output data. The 5-bit output data generated by the 5-bit register 420 may be the same as the data inputted to the "D"-input terminals of the five D-flipflops constituting the 5-bit register 420. Thus, the 5-bit register 420 may initially output the data of '00000' and may then output the 5-bit added data in synchronization with the clock signal CLK. The output data of the 5-bit register 420 may be inputted to both of the 5-bit adder 430 and the comparator 440.

The 5-bit adder 430 may perform an addition operation adding a binary number of "1" to the output data outputted from the 5-bit register 420 and may then output the result of the addition operation as the 5-bit added data. For example, if data of '00001' are inputted to the 5-bit adder 430 from the 5-bit register 420, the 5-bit adder 430 may output the 5-bit added data of '00010'. The comparator 440 may compare the output data of the 5-bit register 420 with reference data to generate the counter output signal CNT_OUT according to the comparison result. In an embodiment, the reference data may be set to be '11111'. In such a case, the comparator 440 does not generate the counter output signal CNT_OUT if the output data of the 5-bit register 420 is less than the reference data of '11111'. In contrast, the comparator 440 may generate the counter output signal CNT_OUT if the output data of the 5-bit register 420 are identical to the reference data of '11111'.

Figure 4:
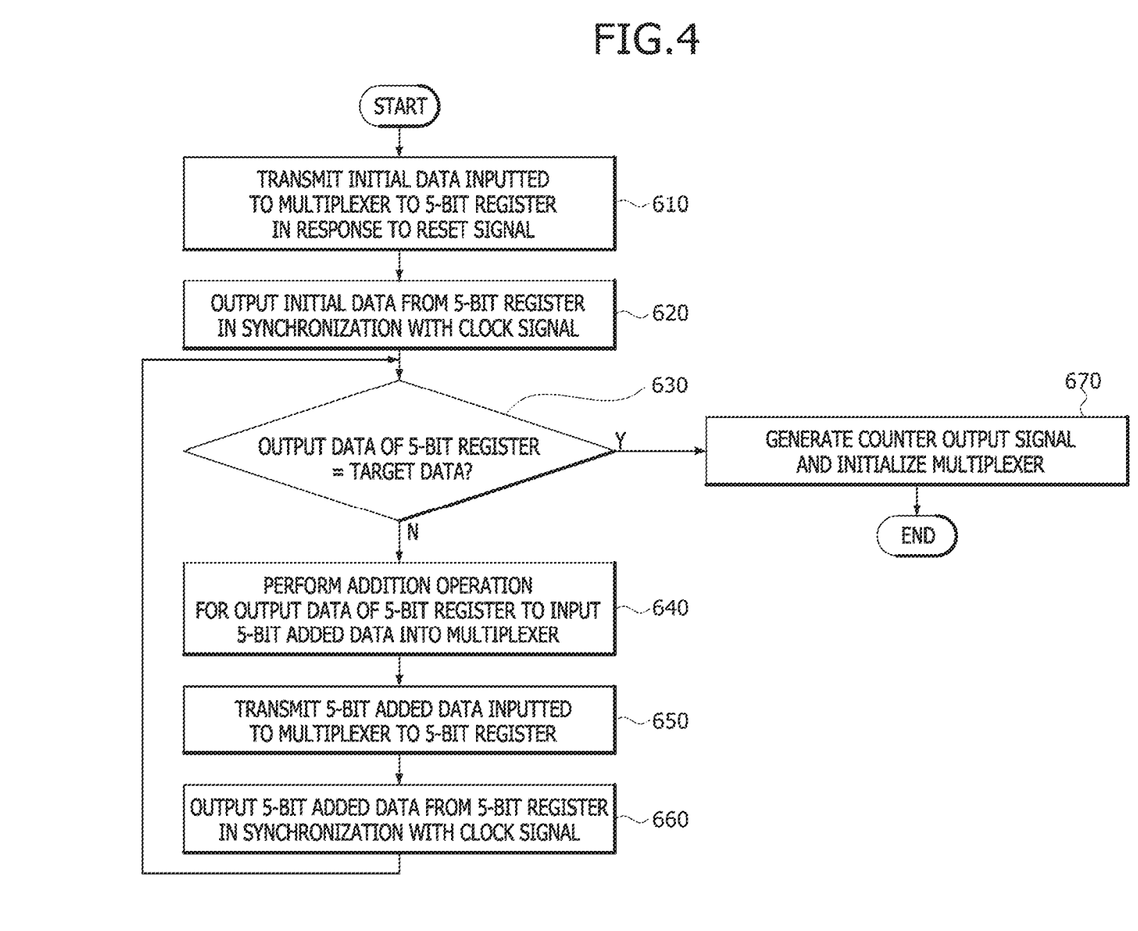
FIG. 4 is a flowchart illustrating an operation of a counter illustrated in FIG. 3.

FIG. 4 is a flowchart illustrating an operation of the 5-bit counter 400 illustrated in FIG. 3. Referring to FIGS. 3 and 4, the multiplexer 410 may output the initial data of '00000' in response to the reset signal RESET and may apply the initial data of '00000' to the 5-bit register 420 (see step 610). The 5-bit register 420 may be synchronized with the clock signal CLK to output the initial data of '00000' (see step 620). The comparator 440 may compare the initial data of '00000' with target data (i.e., the reference data) of '11111' to discriminate whether the initial data are consistent with the target data (see step 630). Since the initial data of '00000' are different from the target data of '11111', the comparator 440 does not generate the counter output signal CNT_OUT. The 5-bit adder 430 may perform an addition operation for the initial data of '00000' outputted from the 5-bit register 420 to generate the added data of '00001' and to apply the added data of '00001' to the multiplexer 410 (see step 640). The multiplexer 410 may transmit the added data of '00001' to the 5-bit register 420 (see step 650). The 5-bit register 420 may be synchronized with the clock signal CLK to output the added data of '00001' (see step 660).

The comparator 440 may compare the added data of '00001' with the target data of '11111' to discriminate whether the added data of '00001' are consistent with the target data (see step 630). Since the added data of '00001' are different from the target data of '11111', the 5-bit adder 430 may perform an addition operation for the added data of '00001' outputted from the 5-bit register 420 to generate the added data of '00010' and to apply the added data of '00010' to the multiplexer 410 (see step 640). The steps 630 to 660 may be iteratively executed until the output data of the 5-bit register 420 are consistent with the target data of '11111' at step 630. If the output data of the 5-bit register 420 are consistent with the target data of '11111' at step 630, the comparator 440 may generate the counter output signal CNT_OUT and the multiplexer 410 may be initialized in response to the reset signal RESET (see step 670). As such, the counter output signal CNT_OUT may be generated by various steps described above. As the reset signal RESET is inputted to the multiplexer 410 at step 670, another cycle for generating the counter output signal CNT_OUT may also be executed in the same way.

Figure 5:
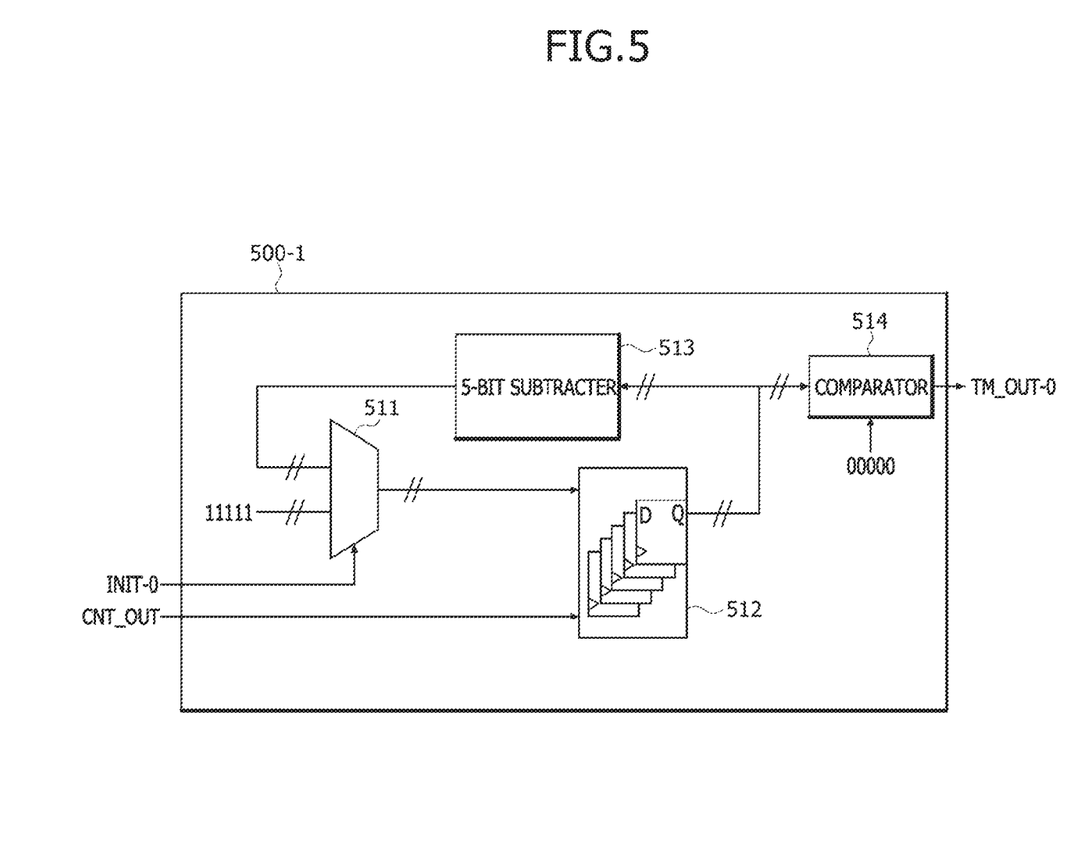
FIG. 5 is a block diagram illustrating a configuration of a first timer of a plurality of timers included in the read time-out manager of FIG. 2.

FIG. 5 is a block diagram illustrating a configuration of the first timer 500-1 among the plurality of timers included in the read time-out manager 320 of FIG. 2. Each of the second to $n^{th}$ timers 500-2, . . . 500-($n$–1), and 500-($n$) may be realized to have substantially the same configuration as the first timer 500-1. Referring to FIG. 5, the first 5-bit timer 500-1 may be configured to include a multiplexer 511, a 5-bit register 512, a 5-bit subtracter 513 and, a comparator 514. The multiplexer 511 may receive 5-bit data of '11111' as initial data and 5-bit subtracted data outputted from the 5-bit subtracter 513. The multiplexer 511 may firstly output the 5-bit initial data of '11111' as initial output data in response to a first initialization control signal INIT-0. After the 5-bit initial data of '11111' are outputted from the multiplexer 511, the multiplexer 511 may output the 5-bit subtracted data which are generated by the 5-bit subtracter 513. The 5-bit initial data of '11111' or the 5-bit subtracted data outputted from the multiplexer 511 may be inputted to the 5-bit register 512.

The 5-bit register 512 may be realized using five D-flipflops. Each of the five D-flipflops may provide one bit. The 5-bit initial data or the 5-bit subtracted data outputted from the multiplexer 511 may be inputted to "D"-input terminals of the five D-flipflops, respectively. Output signals of the five D-flipflops may be outputted through "Q"-output terminals of the five D-flipflops, respectively. The 5-bit register 512 may be synchronized with the counter output signal CNT_OUT, which is outputted from the counter 400, to generate 5-bit output data. The 5-bit output data generated by the 5-bit register 512 may be the same as the data inputted to the "D"-input terminals of the five D-flipflops constituting the 5-bit register 512. Thus, the 5-bit register 512 may initially output the data of '11111' and may then output the 5-bit subtracted data in synchronization with the counter output signal CNT_OUT. The output data of the 5-bit register 512 may be inputted to both of the 5-bit subtracter 513 and the comparator 514.

The 5-bit subtracter 513 may perform a subtraction operation subtracting a binary number of "1" from the output data outputted from the 5-bit register 512 and may then output the result of the subtraction operation as the 5-bit subtracted data. For example, if data of '11110' are inputted to the 5-bit subtracter 513 from the 5-bit register 512, the 5-bit subtracter 513 may output the 5-bit subtracted data of '11101'. The comparator 514 may compare the output data of the 5-bit register 512 with reference data to generate the first time-out signal TM_OUT-0 according to the comparison result. In an embodiment, the reference data may be set to be '00000'. In such a case, the comparator 514 does not generate the first time-out signal TM_OUT-0 if the output data of the 5-bit register 512 is greater than the reference data of '00000'. In contrast, the comparator 514 may generate the first time-out signal TM_OUT-0 if the output data of the 5-bit register 512 are identical to the reference data of '00000'.

Figure 6:
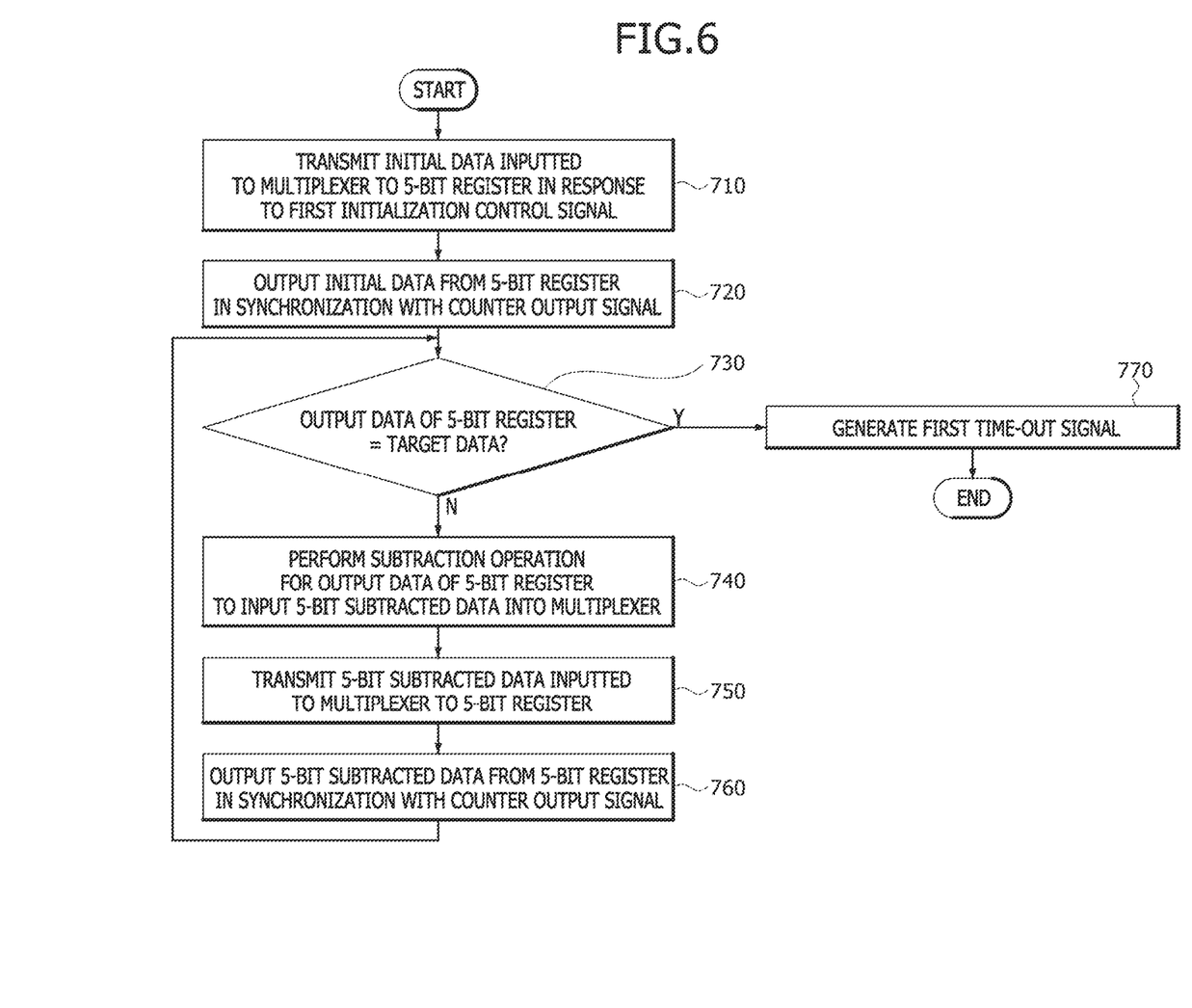
FIG. 6 is a flowchart illustrating an operation of the first timer illustrated in FIG. 5.

FIG. 6 is a flowchart illustrating an operation of the first timer 500-1 illustrated in FIG. 5. In an embodiment, an operation of each of the second to $n^{th}$ timers 500-2, . . . 500-($n$–1), and 500-($n$) may be substantially the same as an operation of the first timer 500-1. Referring to FIGS. 5 and 6, the multiplexer 511 may output the initial data of '11111' in response to the first initialization control signal INIT-0 and may apply the initial data of '11111' to the 5-bit register 512 (see step 710). The initial data of '11111' may be stored into the D-flipflops constituting the 5-bit register 512, and the 5-bit register 512 may be synchronized with the counter output signal CNT_OUT to output the initial data of '11111' (see step 720). The comparator 514 may compare the initial data of '11111' with target data (i.e., the reference data) of '00000' to discriminate whether the initial data are consistent with the target data (see step 730). Since the initial data of '11111' are different from the target data of '00000', the comparator 514 does not generate the time-out signal TM_OUT. The 5-bit subtracter 513 may perform a subtraction operation for the initial data of '11111' outputted from the 5-bit register 512 to generate the subtracted data of '11110' and to apply the subtracted data of '11110' to the multiplexer 511 (see step 740). The multiplexer 511 may transmit the subtracted data of '11110' to the 5-bit register 512 (see step 750). The 5-bit register 512 may be synchronized with the counter output signal CNT_OUT to output the subtracted data of '11110' (see step 760).

The comparator 514 may compare the subtracted data of '11110' with the target data of '00000' to discriminate whether the subtracted data are consistent with the target data (see step 730). Since the subtracted data of '11110' are different from the target data of '00000', the comparator 514 does not generate the time-out signal TM_OUT. The 5-bit subtracter 513 may perform a subtraction operation for the subtracted data of '11110' outputted from the 5-bit register 512 to generate the subtracted data of '11101' and to apply the subtracted data of '11101' to the multiplexer 511 (see step 740). That is, the steps 730 to 760 may be iteratively executed until the output data of the 5-bit register 512 are consistent with the target data of '00000' at step 730. If the output data of the 5-bit register 512 are consistent with the target data of '00000' at step 730, the comparator 514 may generate the first time-out signal TM_OUT-0 (see step 770).

Figure 7:
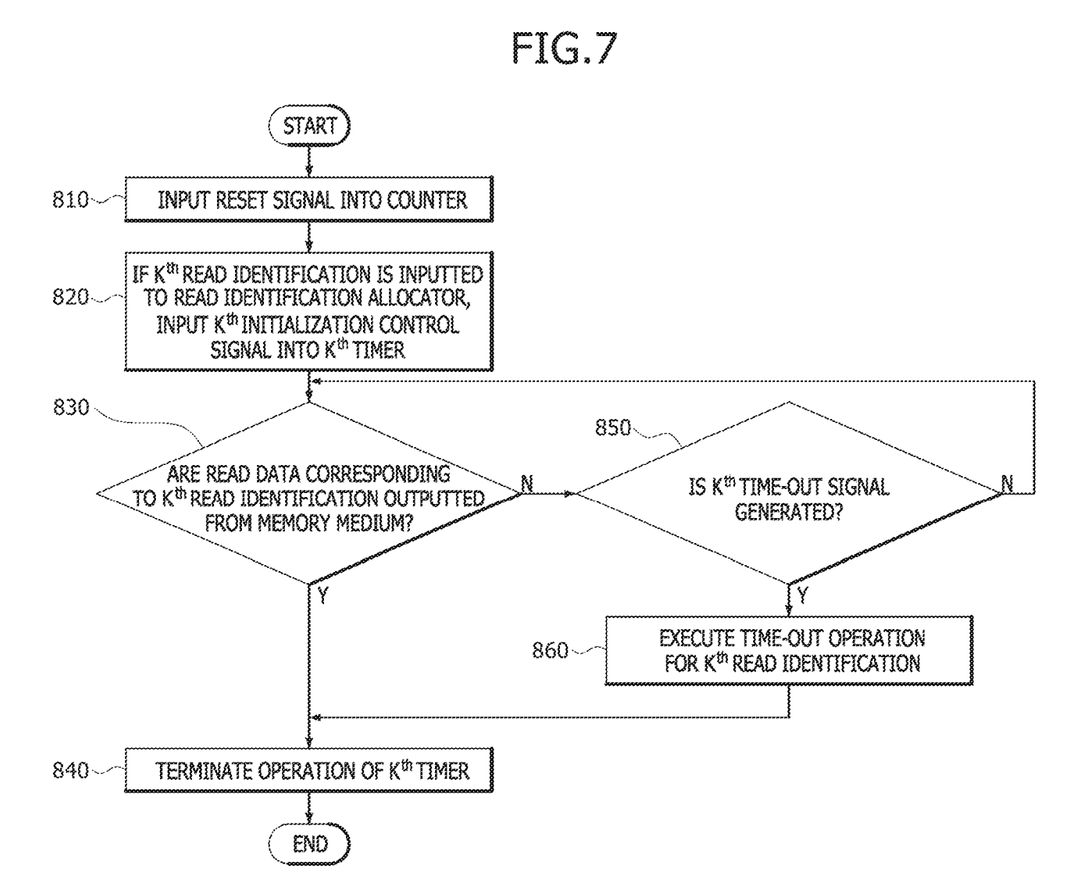
FIG. 7 is a flowchart illustrating an operation of a read time-out manager according to an embodiment of the present disclosure.

FIG. 7 is a flowchart illustrating an operation of the read time-out manager 320 according to an embodiment of the present disclosure. Referring to FIGS. 2, 3, 5, and 7, the reset signal RESET may be inputted to the 5-bit counter 400 (see step 810). If the reset signal RESET is inputted to the 5-bit counter 400, the counter 400 may execute a counting operation in synchronization with the clock signal CLK as described with reference to FIG. 4. During the counting operation, the counter 400 may output the counter output signal CNT_OUT to all of the first to $n^{th}$ timers 500-1, 500-2, ..., 500-(n−1), and 500-(n) on a first cycle time corresponding to thirty two cycle times of the clock signal CLK. For example, for every first cycle time, the counter output signal CNT_OUT may be generated by the counter 400. For example, for every first cycle time, the counter output signal CNT_OUT may be outputted by the counter 400. For example, the counter output signal CNT_OUT may be generated by the counter 400 in synchronization with the first cycle time. For example, the first cycle time the counter output signal CNT_OUT may be outputted by the counter 400 in synchronization with the first cycle time. While the counter 400 executes the counting operation, a $k^{th}$ initialization control signal INIT-(k−1) may be inputted to the $k^{th}$ timer 500-(k) [e.g., inputted to the multiplexer of the $k^{th}$ timer 500-(k)] if a $k^{th}$ read identification RID-(k−1) is inputted to the read time-out manager 320 [e.g., inputted to the RID allocator 321 of the read time-out manager 320] from the command/data processor 310 (where, "k" is one of natural numbers of "1" to "n") (see step 820). If the $k^{th}$ read identification RID-(k−1) is inputted to the read time-out manager 320, the $k^{th}$ timer 500-(k) may operate in synchronization with the counter output signal CNT_OUT as described with reference to FIG. 6. The $k^{th}$ timer 500-(k) may operate until a $k^{th}$ time-out signal TM_OUT-(k−1) is generated (determined at step 850) or a read operation defined by the $k^{th}$ read identification RID-(k−1) is executed (determined at step 830).

Specifically, while the $k^{th}$ timer 500-(k) operates, the read time-out manager 320 may discriminate whether read data corresponding to the $k^{th}$ read identification RID-(k−1) are outputted from the memory medium 200 (see step 830). Step 830 may be executed according to whether the flag signal FLAG is inputted to the read time-out manager 320, as described with reference to FIG. 2. If the read data corresponding to the $k^{th}$ read identification RID-(k−1) are transmitted from the memory medium 200 to the command/data processor 310 (determined at step 830), an operation of the $k^{th}$ timer 500-(k) may terminate because the time-out operation for the $k^{th}$ read identification RID-(k−1) is not required any more (see step 840). If a read operation of the read data corresponding to the $k^{th}$ read identification RID-(k−1) is not performed (determined at step 830), the read time-out manager 320 may discriminate whether the $k^{th}$ time-out signal TM_OUT-(k−1) for the $k^{th}$ read identification RID-(k−1) is generated (see step 850). If the $k^{th}$ time-out signal TM_OUT-(k−1) is not generated (determined at step 850), step 830 may be executed again. If the $k^{th}$ time-out signal TM_OUT-(k−1) is generated (determined at step 850), the time-out operation for the $k^{th}$ read identification RID-(k−1) may be executed because generation of the $k^{th}$ time-out signal TM_OUT-(k−1) means elapse of the time-out period for the $k^{th}$ read identification RID-(k−1) (see step 860). Subsequently, an operation of the $k^{th}$ timer 500-(k) may terminate (see step 840). In an embodiment, when the operation of the $k^{th}$ timer 500-(k) is terminated, the time-out operation (i.e., read time-out operation) for the $k^{th}$ read identification RID-(k−1) may be terminated as well. In an embodiment, for example, the command/data processor 310 may execute an operation for terminating the time-out operation for the $k^{th}$ read identification RID-(k−1) [e.g., by executing an operation to terminate the operation of the $k^{th}$ timer 500-(k)] in response to the $k^{th}$ time-out signal TM_OUT-(k−1) outputted from the read time-out manager 320.

As described above, the read time-out manager 320 according to an embodiment may measure or count the time-out period corresponding to 1024 cycle times (i.e., $2^{10}$ cycle times) of the clock signal CLK using only a single 5-bit counter 400 and only "n"-number of 5-bit timers 500-1, 500-2, ..., 500-(n−1), and 500-(n). Generally, one 10-bit timer may be assigned to one read identification RID to measure or count the time-out period corresponding to 1024 cycle times (i.e., $2^{10}$ cycle times) of the clock signal CLK. That is, if a maximum time-out period corresponding to one read identification is set to be 1024 cycle times (i.e., $2^{10}$ cycle times) of the clock signal CLK, "n"-number of 10-bit timers may be required to measure or count the "n"-number of time-out periods for "n"-number of read identifications. However, the read time-out manager 320 according to an embodiment may be configured to include the one 5-bit counter 400 and the "n"-number of 5-bit timers 500-1, 500-2, ..., 500-(n−1), and 500-(n) instead of the "n"-number of 10-bit timers, unlike the general case. Thus, it may be possible to reduce volume and/or size of the read time-out manager 320 as compared with a general read time-out manager including the "n"-number of 10-bit timers. In some embodiments, in case of the read time-out manager 320, the predetermined time-out period is correctly counted or measured. Thus, a read time-out operation may be performed during the predetermined time-out period. In other embodiments, in case of the read time-out manager 320, the predetermined time-out period might not be correctly counted or measured. However, a certain variation of the time-out period may be allowable without any damage to the read time-out operation because of the nature of the read time-out operation. The read time-out operation will be described in more detail hereinafter with reference to FIG. 8.

Figure 8:
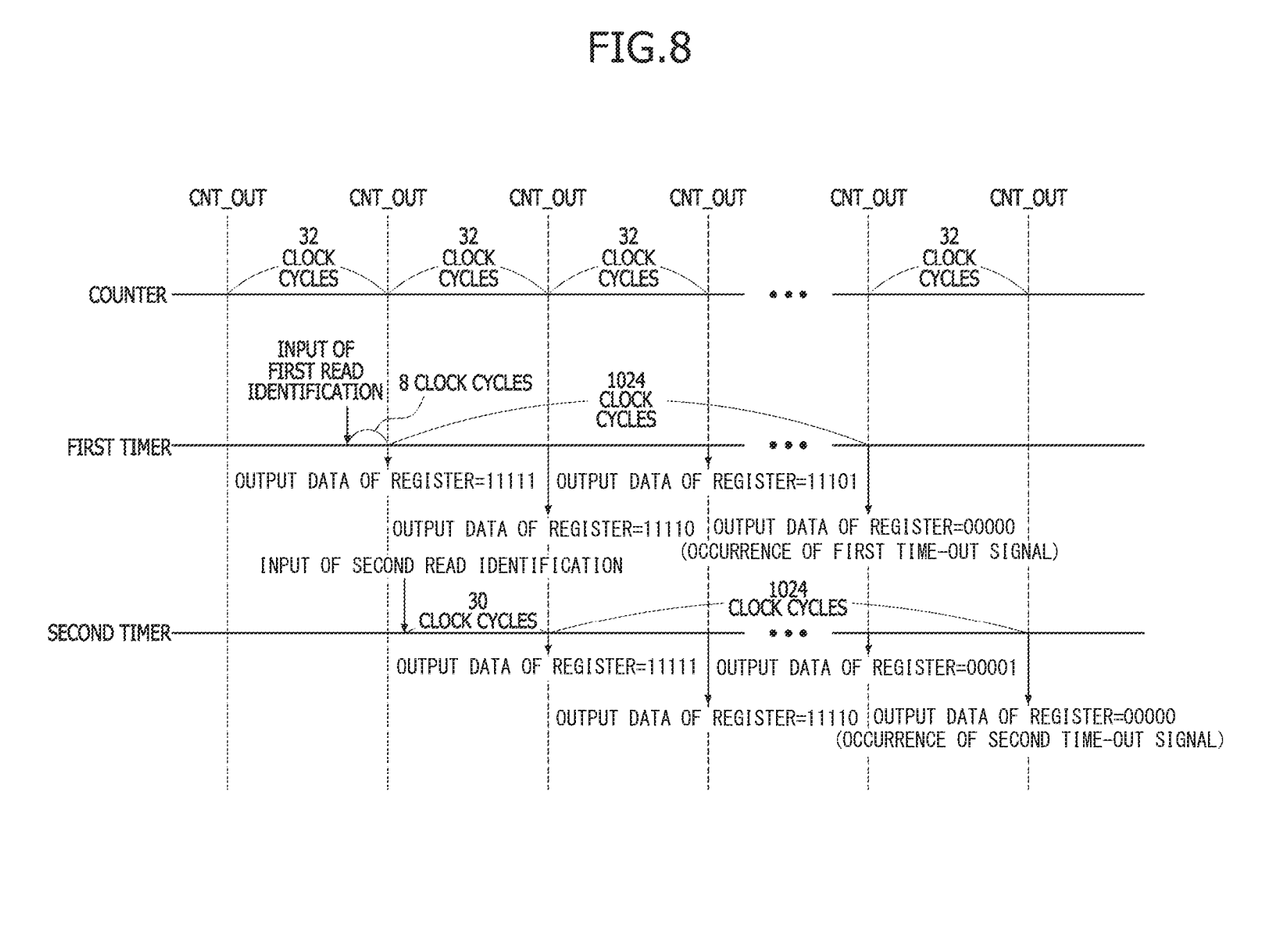
FIG. 8 illustrates output signals of a counter, a first timer, and a second timer included in a read time-out manager according to an embodiment of the present disclosure.

FIG. 8 illustrates output signals of the counter 400, the first timer 500-1, and the second timer 500-2 included in the read time-out manager 320 according to an embodiment of the present disclosure. Referring to FIG. 8, the counter 400 may generate the counter output signal CNT_OUT every thirty-two pulses of the clock signal CLK (i.e., every 32 clock cycles). In FIG. 8, it may be assumed that the first read identification RID-0 is inputted before 8 clock cycle times from a point of time that the second counter output signal CNT_OUT is generated. In addition, it may also be assumed that the second read identification RID-1 is inputted before 30 clock cycle times from a point of time that the third counter output signal CNT_OUT is generated. In case of the first timer 500-1, the 5-bit register 512 of the first timer 500-1 may generate the output data of '11111' at a point of time that the second counter output signal CNT_OUT is generated after the first read identification RID-0 is inputted. At this time, the first time-out signal TM_OUT-0 might not be generated. Subsequently, the 5-bit register 512 of the first timer 500-1 may generate the output data of '11110' at a point of time that the third counter output signal CNT_OUT is generated after 32 clock cycle times elapses from the point of time that the 5-bit register 512 of the first timer 500-1 generates the output data of '11111'. Even at this time, the first time-out signal TM_OUT-0 might not be generated. Next, the 5-bit register 512 of the first timer 500-1 may generate the output data of '11101' at a point of time that the fourth counter output signal CNT_OUT is generated after 32 clock cycle times elapses from the point of time that the 5-bit register 512 of the first timer 500-1 generates the output data of '11110'. Even at this time, the first time-out signal TM_OUT-0 might not be generated. These processes may be iteratively executed while "32"-number of the counter output signals CNT_OUT are generated. The 5-bit register 512 of the first timer 500-1 may generate the output data of '00000' at a point of time that the thirty fourth counter output signal CNT_OUT is generated, and the first time-out signal TM_OUT-0 may also be generated at the point of time that the thirty fourth counter output signal CNT_OUT is generated.

In case of the second timer 500-2, the 5-bit register of the second timer 500-2 may generate the output data of '11111' at a point of time that the third counter output signal CNT_OUT is generated after the second read identification RID-1 is inputted. At this time, the second time-out signal TM_OUT-1 might not be generated. Subsequently, the 5-bit register of the second timer 500-2 may generate the output data of '11110' at a point of time that the fourth counter output signal CNT_OUT is generated after 32 clock cycle times elapses from the point of time that the 5-bit register of the second timer 500-2 generates the output data of '11111'. These processes may be iteratively executed until the thirty fourth counter output signal CNT_OUT is generated. The 5-bit register of the second timer 500-2 may generate the output data of '00001' at a point of time that the thirty fourth counter output signal CNT_OUT is generated. Even at this time, the second time-out signal TM_OUT-1 might not be generated. Next, the 5-bit register of the second timer 500-2 may generate the output data of '00000' at a point of time that the thirty fifth counter output signal CNT_OUT is generated, and the second time-out signal TM_OUT-1 may also be generated at the point of time that the thirty fifth counter output signal CNT_OUT is generated.

In case of the first timer 500-1 to which the first read identification RID-0 is assigned, the time-out operation may be performed during a period of 1032 clock cycle times that corresponds to a sum of 8 clock cycle times it takes the second counter output signal CNT_OUT to be generated after the first read identification RID-0 is inputted and 1024 clock cycle times it takes the first time-out signal TM_OUT-0 to be generated after the second counter output signal CNT_OUT is generated. Although there is a time difference of 8 clock cycle times between the actual time-out period (i.e., 1032 clock cycle times) and the predetermined time-out period of 1024 clock cycle times, the time-out operation does not terminate before the predetermined time-out period elapses. Thus, the time-out operation might not be affected by the variation of the actual time-out period. Similarly, even in case of the second timer 500-2 to which the second read identification RID-1 is assigned, the time-out operation may be performed during a period of 1054 clock cycle times that corresponds to a sum of 30 clock cycle times it takes the third counter output signal CNT_OUT to be generated after the second read identification RID-1 is inputted and 1024 clock cycle times it takes the second time-out signal TM_OUT-1 to be generated after the third counter output signal CNT_OUT is generated. Even in this case, there is a time difference of 30 clock cycle times between the actual time-out period (i.e., 1054 clock cycle times) and the predetermined time-out period of 1024 clock cycle times, the time-out operation does not terminate before the predetermined time-out period elapses. Thus, the time-out operation might not be affected by the variation of the actual time-out period.

Embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A read time-out manager comprising:
a counter configured to generate a counter output signal based on a first cycle time; and
a plurality of timers each configured to be assigned a read identification to measure a time-out period corresponding to the read identification,
wherein each of the plurality of timers operates in synchronization with the counter output signal to generate a time-out signal based on a second cycle time different from the first cycle time.

2. The read time-out manager of claim 1, wherein when each of the time-out periods is set to be a period corresponding to $2^m$ cycle times of a clock signal (where, "m" denotes a natural number), the counter and each of the timers are respectively configured to have "a" bits and "b" bits (where, a sum of the value of "a" and the value of "b" is equal to the value of "m").

3. The read time-out manager of claim 2, wherein the first cycle time is set to be a period corresponding to $2^a$ cycle times of the clock signal, and the second cycle time is set to be a period corresponding to $2^{(a+b)}$ cycle times of the clock signal.

4. The read time-out manager of claim 2, wherein a countable capacity of the counter is set to be equal to a countable capacity of each of the plurality of timers.

5. The read time-out manager of claim 2, wherein a countable capacity of the counter is set to be different from a countable capacity of each of the plurality of timers.

6. The read time-out manager of claim 1, wherein the counter includes:
a multiplexer configured to firstly output initial data inputted to a first input terminal of the multiplexer as output data in response to a reset signal and configured to, thereafter, output data inputted to a second input terminal of the multiplexer as the output data;
a register configured to receive and output the output data of the multiplexer in synchronization with a clock signal;
an adder configured to perform an addition operation for output data of the register to generate added data and configured to output the added data to the second input terminal of the multiplexer; and
a comparator configured to compare the output data of the register with reference data and configured to generate the counter output signal according to the comparison result.

7. The read time-out manager of claim 6, wherein the register is realized using D-flipflops.

8. The read time-out manager of claim 1, wherein each of the plurality of timers includes:
a multiplexer configured to firstly output initial data inputted to a first input terminal of the multiplexer as output data in response to an initialization control signal and configured to, thereafter, output data inputted to a second input terminal of the multiplexer as the output data;
a register configured to receive and output the output data of the multiplexer in synchronization with the counter output signal;
a subtracter configured to perform a subtraction operation for output data of the register to generate subtracted data and configured to output the subtracted data to the second input terminal of the multiplexer; and
a comparator configured to compare the output data of the register with reference data and configured to generate the time-out signal according to the comparison result.

9. The read time-out manager of claim 8, wherein the initialization control signal is inputted to the multiplexer included in a timer from the plurality of timers based on a read identification inputted to the read time-out manager.

10. The read time-out manager of claim 8, wherein the register included in each of the plurality of timers is realized using D-flipflops.

11. A memory system comprising:
a memory medium; and
a memory controller configured to control an operation for accessing the memory medium,
wherein the memory controller includes a read time-out manager configured to perform time-out operations for a plurality of read identifications of read data, the read data to be read out from the memory medium based on read commands, and
wherein the read time-out manager comprises:
a counter configured to generate a counter output signal based on a first cycle time; and
a plurality of timers each configured to be assigned a read identification from the plurality of read identifications to measure a time-out period corresponding to the read identification,
wherein each of the plurality of timers operates in synchronization with the counter output signal to generate a time-out signal based on a second cycle time different from the first cycle time.

12. The memory system of claim 11, wherein when each of the time-out periods is set to be a period corresponding to $2^m$ cycle times of a clock signal (where, "m" denotes a natural number), the counter and each of the timers are respectively configured to have "a" bits and "b" bits (where, a sum of the value of "a" and the value of "b" is equal to the value of "m").

13. The memory system of claim 12, wherein the first cycle time is set to be a period corresponding to $2^a$ cycle times of the clock signal, and the second cycle time is set to be a period corresponding to $2^{(a+b)}$ cycle times of the clock signal.

14. The memory system of claim 12, wherein a countable capacity of the counter is set to be equal to a countable capacity of each of the plurality of timers.

15. The memory system of claim 12, wherein a countable capacity of the counter is set to be different from a countable capacity of each of the plurality of timers.

16. The memory system of claim 11, wherein the counter includes:
a multiplexer configured to firstly output initial data inputted to a first input terminal of the multiplexer as output data in response to a reset signal and configured to, thereafter, output data inputted to a second input terminal of the multiplexer as the output data;
a register configured to receive and output the output data of the multiplexer in synchronization with a clock signal;
an adder configured to perform an addition operation for output data of the register to generate added data and configured to output the added data to the second input terminal of the multiplexer; and
a comparator configured to compare the output data of the register with reference data and configured to generate the counter output signal according to the comparison result.

17. The memory system of claim 16, wherein the register is realized using D-flipflops.

18. The memory system of claim 11, wherein each of the plurality of timers includes:
a multiplexer configured to firstly output initial data inputted to a first input terminal of the multiplexer as output data in response to an initialization control signal and configured to, thereafter, output data inputted to a second input terminal of the multiplexer as the output data;
a register configured to receive and output the output data of the multiplexer in synchronization with the counter output signal;
a subtracter configured to perform a subtraction operation for output data of the register to generate subtracted data and configured to output the subtracted data to the second input terminal of the multiplexer; and
a comparator configured to compare the output data of the register with reference data and configured to generate the time-out signal according to the comparison result.

19. The memory system of claim 18, wherein the initialization control signal is inputted to the multiplexer included in a timer from the plurality of timers based on a read identification from the plurality of read identifications inputted to the read time-out manager.

20. The memory system of claim 18, wherein the register included in each of the plurality of timers is realized using D-flipflops.

21. The memory system of claim 11, wherein the memory controller further includes a command and data processor configured to transmit the plurality of read identifications to the read time-out manager in response to the read commands and configured to execute an operation for terminating the time-out operation for a read identification from the plurality of read identifications in response to the time-out signal, corresponding to the read identification, outputted from the read time-out manager.

* * * * *